(12) United States Patent
Sekigawa et al.

(10) Patent No.: US 7,179,584 B2
(45) Date of Patent: Feb. 20, 2007

(54) EXPOSURE METHOD AND DEVICE FOR FORMING PATTERNS ON PRINTED WIRING BOARD

(75) Inventors: Kazunari Sekigawa, Nagano (JP); Masatoshi Akagawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 398 days.

(21) Appl. No.: 10/328,449

(22) Filed: Dec. 23, 2002

(65) Prior Publication Data

US 2003/0124463 A1 Jul. 3, 2003

(30) Foreign Application Priority Data

Dec. 27, 2001 (JP) .............................. 2001-397519

(51) Int. Cl.
*G03F 7/30* (2006.01)

(52) U.S. Cl. ...................... 430/326; 430/394; 438/446; 347/233; 347/234; 347/235; 347/239

(58) Field of Classification Search ................ 430/328, 430/394, 326; 359/204; 438/446; 372/25, 372/28, 26; 347/233, 234, 235, 239
See application file for complete search history.

(56) References Cited

U.S. PATENT DOCUMENTS

| 4,496,216 | A | * | 1/1985 | Cowan | 359/566 |
| 5,296,958 | A | * | 3/1994 | Roddy et al. | 359/204 |
| 5,496,768 | A | * | 3/1996 | Kudo | 438/487 |
| 5,759,744 | A | * | 6/1998 | Brueck et al. | 430/312 |
| 5,981,974 | A | * | 11/1999 | Makita | 257/72 |
| 6,033,831 | A | * | 3/2000 | Ikeda et al. | 430/363 |
| 6,462,879 | B2 | * | 10/2002 | Masuda | 359/626 |
| 6,509,955 | B2 | * | 1/2003 | Mei et al. | 355/53 |
| 2002/0159122 | A1 | * | 10/2002 | Aoki et al. | 359/204 |
| 2004/0197683 | A1 | * | 10/2004 | Sekigawa et al. | 430/30 |

FOREIGN PATENT DOCUMENTS

| JP | 11195589 A | 7/1999 |
| JP | 2000222449 A | 8/2000 |

* cited by examiner

*Primary Examiner*—John S. Chu
(74) *Attorney, Agent, or Firm*—Paul & Paul (57) ABSTRACT

An optical exposure method and a device are used for forming patterns on a printed board wiring or semiconductor board. A single exposing region of a surface to be exposed is irradiated with a plurality of optical beams having different irradiating areas and different scanning pitches, such as, a peripheral area is irradiated with an optical beam having a smaller irradiating area and an inner area is irradiated with an optical beam having a larger irradiating area.

9 Claims, 9 Drawing Sheets

SCANNING

EXPOSURE METHOD AND DEVICE FOR FORMING PATTERNS ON PRINTED WIRING BOARD

BACKGROUND OF THE INVENTION

1. Field of the Invention

The present invention relates to an exposure method and device. More particularly, the present invention relates to an exposure method and device for forming an exposure pattern on a printed wiring board, package or semiconductor substrate (semiconductor wafer) with a plurality of optical sources capable of irradiating light on different irradiating areas and at scanning pitches. Further, the present invention relates to a medium into which a program for executing the above exposure method is incorporated.

When a printed circuit board or package is manufactured by a conventional manufacturing method, a pattern such as a wiring pattern is formed by a technique, called photolithography, using a photomask.

2. Description of the Related Art

A conventional exposure method according to the photolithography technique uses a set of photo masks. Exposure light emitted from the optical source passes through the photo mask and is irradiated on the substrate, on the surface of which a resist is coated. Due to the irradiation of light, the exposed portion is formed according to the pattern profile of the photo mask. However, in the conventional exposure method using a set of photo masks, it is necessary to reproduce, maintain and keep the photo mask, which is expensive. Further, when the design is changed, it is necessary to remake the mask, which is also expensive.

A maskless exposure method is also known. In this method, the laser beam is directly irradiated onto the substrate, on the surface of which the resist is coated, by a laser beam source. On the other hand, the substrate or the laser beam source is subjected to scanning according to a predetermined pattern. Drawing data, which are uniformly digitized, are inputted into optical source unit by the high speed memory. Due to the above scanning conducted by the laser beam, the exposed section can be formed.

However, it is necessary to reduce the beam size and the scanning pitch to obtain a fine pattern. Necessarily, the quantity of drawing data to be processed is increased, and it becomes difficult or impossible to quickly process such a large quantity of drawing data by the system of the exposure device. As a result, throughput is lowered.

SUMMARY OF THE INVENTION

An object of the present invention is to provide an exposure method and device in which a throughput of optical exposure can be improved by using a plurality of optical sources having different beam sizes.

The present invention provides a fundamental technique, which has been developed on the basis of a "Maskless Exposure Machine Produced by Ball Semiconductor Co.", for preventing deterioration of the scanning performance (throughput of exposure) which is caused by an increase in the quantity of drawing data when a drawing beam size is reduced and resolving power is enhanced which is inevitable when exposure data are made fine.

It is considered that the present proposal can also be applied to other directly drawing devices and systems in which a beam is used for drawing.

According to the present invention, there is provided an optical exposure method for forming patterns on a surface of a work, such as a wiring board or semiconductor board, said method comprising the following step of: irradiating a single exposing region of a surface to be exposed with a plurality of optical beams, such as laser beams, having different irradiating areas and having different scanning pitches, respectively.

As described above, in the present invention, there are provided a plurality of optical sources for realizing different beam irradiating areas. Therefore, in a region to be exposed, it is possible to conduct exposure in such a manner that a fine exposure pattern portion is exposed to light with one optical source and a coarse exposure pattern portion is exposed with another optical source, that is, a fine exposure pattern portion and coarse exposure pattern portion can be respectively exposed to light with different optical sources. Beams of different irradiating areas include a beam of a small size and beam of a large size. In this connection, the section of the beam is not limited to a circle but the section of the beam may be an ellipse or a rectangle.

The single exposing region on a surface to be exposed comprises a peripheral area and an inner area, and the irradiating step comprises: irradiating the peripheral area with a first optical source of a beam having a smaller irradiating area and irradiating the inner area with a second optical source of a beam having a larger irradiating area.

When a peripheral region of the exposure region is exposed to light with the first optical source suitable for drawing a fine pattern and an inner region of the exposure region is exposed to light with the second optical source suitable for drawing a solid pattern, throughput can be greatly enhanced in the case of exposing one exposure region to light. When the peripheral region of the exposure region is finely scanned with the first optical source and the inner region of the exposure region is roughly scanned with the second optical source, throughput can be further enhanced in the case of exposing one exposure region to light.

The optical exposure method further comprises the following steps of: extracting the inner area from the exposing region, the extracting step comprising a step of thinning by a predetermined amount ($\alpha$) inward from a peripheral outline of a figure (A) of the exposing region so that a figure (B) is obtained by such a thinning step.

The optical exposure method further comprises the following steps of graphic processing: subtracting the figure (B) obtained by the preceding thinning step from the figure (A) of the exposing region to obtain a figure (C); splitting the figure (C) thus obtained into a plurality of areas, each of which is a single unit of space which can be exposed by a single beam having the smaller irradiating area; thickening the figure (B) obtained by the thinning step by a predetermined amount ($\beta$), which is smaller than the predetermined amount ($\alpha$) at the thinning step, outward so that a figure (D) is obtained by such a thickening step; and splitting the figure (D) thus obtained by the thickening step into a plurality of areas, each of which is a single unit of space which can be exposed by a single beam having the larger irradiating area.

The surface to be exposed comprises a surface of a wiring or semiconductor board and wherein the method further comprising the following step of: independently scanning a first optical source of the single beam having the smaller irradiating area and a second optical source of the single beam having the larger irradiating area with respect to the board.

An optical exposure method further comprises the following steps of: inputting the figure data (C, D) into a data base; conducting a retrieval of the figure data (C, D), which belongs to the region to be graphically processed, synchronously with the scanning step from the data base; digitizing the retrieval figure data; and accumulating the digitized figure data in a memory.

An optical exposure method further comprises the following steps of: reading out the digitized data from the memory by an optical source unit for controlling the first and second optical sources; and driving the first and second optical sources on the basis of the digitized data.

According to another aspect of the present invention, there is provided an optical medium incorporated therein a program conducting the following steps of: thinning a peripheral outline of a figure (A) of an exposing region by a predetermined amount ($\alpha$) inward from so that a figure (B) is obtained by such a thinning process; subtracting the figure (B) obtained by the thinning step from the figure (A) of the exposing region to obtain a figure (C); thickening the figure (B) obtained by the thinning step by a predetermined amount ($\beta$), which is smaller than the predetermined amount ($\alpha$) at the thinning step, outward so that a figure (D) is obtained by such a thickening step; and splitting the plurality of figures (C, D) thus obtained by the thickening step into a plurality of areas, each of which is a single unit of space which can be exposed by a single beam having the larger or smaller irradiating area.

According to still another aspect of the present invention, there is provided an optical exposure device for forming patterns on a surface of a work, such as a printed wiring board or semiconductor board, the device comprising: a plurality of optical sources having different beam irradiating areas; scanning means for scanning at least one of the optical beams and the board; and control means for controlling scanning pitch for the respective optical beams.

The plurality of optical sources comprises a first optical source for irradiating an optical beam having a smaller irradiating area and a second optical source for irradiating an optical beam having a larger irradiating area; and control means for controlling the first and second optical sources in such a manner that a peripheral area of the exposing region to be exposed can be exposed by the first optical source and an inner area of the exposing region can be exposed by the second optical source.

An optical exposure device comprises: means for extracting the inner area from the exposing region by thinning inward a peripheral outline of a figure (A) of the exposing region by a predetermined amount ($\alpha$) from so that a figure (B) is obtained; means for subtracting the figure (B) obtained by the preceding thinning step from the figure (A) of the exposing region to obtain a figure (C); means for splitting the figure (C) thus obtained into a plurality of areas, each of which is a single unit of space which can be exposed by a single beam having the smaller irradiating area; means for thickening said figure (B) obtained by the thinning step by a predetermined amount ($\beta$), which is smaller than said predetermined amount ($\alpha$) at the thinning step, outward so that a figure (D) is obtained by such a thickening step; and means for splitting said figure (D) thus obtained by the thickening step into a plurality of areas, each of which is a single unit of space which can be exposed by a single beam having said larger irradiating area.

An optical exposure device further comprises: means for inputting the figure data (C, D) into a data base; means for conducting a retrieval of the figure data (C, D), which belongs to the region to be graphically processed, synchronously with said scanning step from the data base; means for digitizing the retrieval figure data; and means or accumulating the digitized figure data in a memory.

DETAILED EXPLANATION OF THE INVENTION

Referring to the accompanying drawings, the present invention will be explained in detail as follows.

Before the detailed explanation of the embodiment, some of the general exposure methods will be described.

Figure 1:
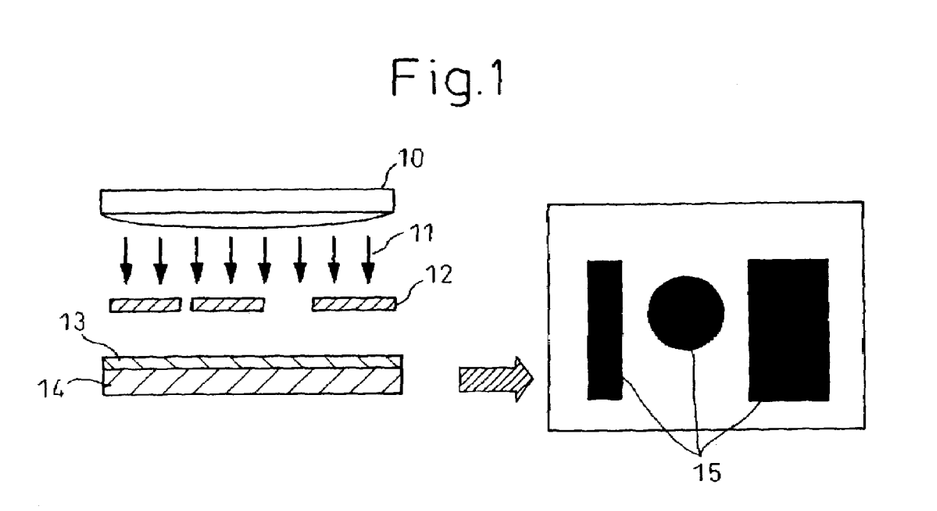
FIG. 1 is a view showing an exposure method performed by a photolithographic technique with a laser beam in which a photo mask is used.

FIG. 1 is a view showing an exposure method according to the technique of photolithography in which a photo mask is used. Exposure light (11) emitted from the optical source (10) passes through the photo mask (12) and is irradiated on the substrate (14), on the surface of which resist (13) is coated. Due to the irradiation of light, the exposure portion (15) shown on the right of FIG. 1 is formed according to the pattern profile of the photo mask (12). As described above, this technique has disadvantages which are caused by using the photo mask. When the photo mask is used, it is necessary to reproduce, maintain and keep the photo mask, which is expensive. Further, when the design of the photomask is changed, it is necessary to remake the mask itself, which is also expensive.

In order to solve the above problems, attention has been recently given to a technique (device) in which photo resist on the substrate is directly exposed to a laser beam without using the photomask. As the size of the wiring pattern on the substrate has become smaller recently, it has become more difficult to conduct a simultaneous exposure on a large scale substrate with a photomask. Accordingly, investigations have been made into split exposure as an inevitable result. On the other hand, the technique of direct beam irradiating exposure described above can avoid the use of split exposure.

Figure 2:
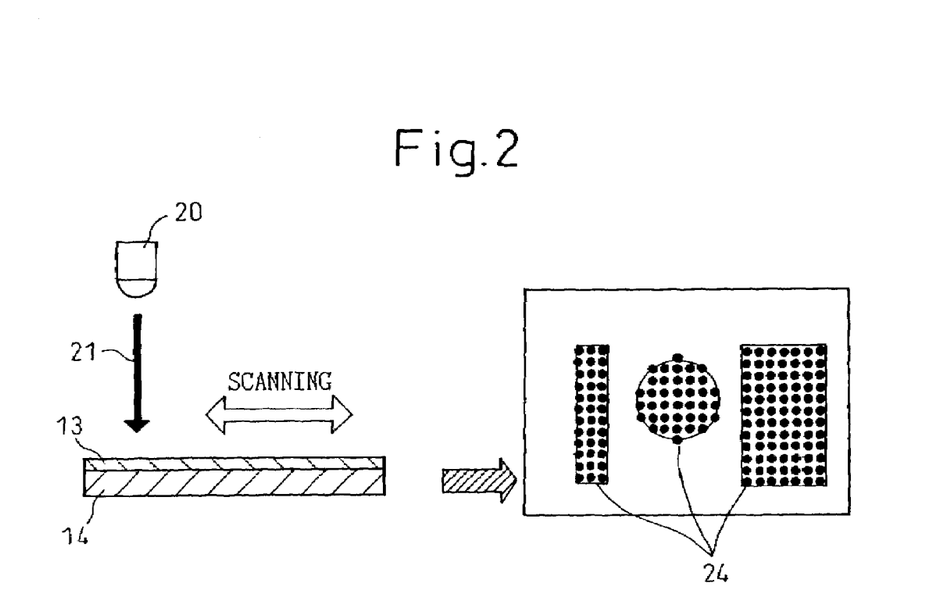
FIG. 2 is a view showing a maskless exposure method conducted by a laser beam.
Figure 4:
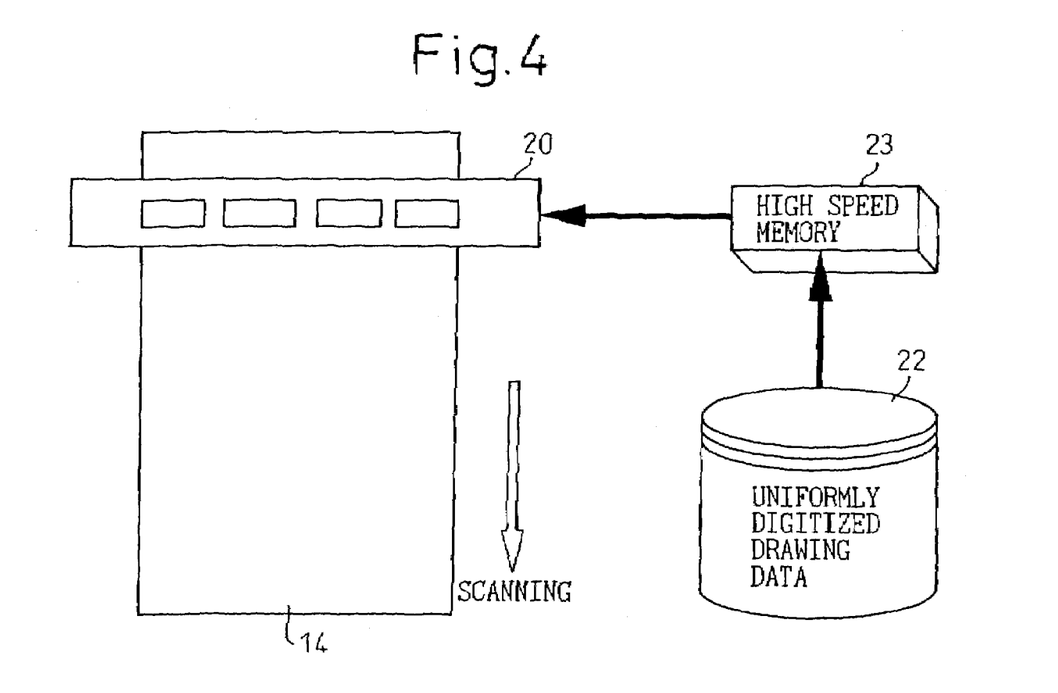
FIG. 4 is a view schematically showing a maskless exposure device conducted by a laser beam.

FIG. 2 is a view showing a maskless exposure method conducted by a laser beam. FIG. 4 is a view showing the principle of an exposure device in which the above-mentioned maskless beam exposure method is adopted. As shown in FIGS. 2 and 4, the laser beam (21) is directly irradiated onto the substrate (14), on the surface of which the resist (13) is coated, by a laser beam source, for example, by DMD (Digital Micro-mirror Device) optical source unit (20). On the other hand, the substrate or the laser beam source is subjected to scanning according to a predetermined pattern. Drawing data (22), which are uniformly digitized, are inputted into DMD optical source unit (20) by a high speed memory (23). Due to the above scanning conducted by the laser beam, the exposed sections (24) shown on the right of FIG. 2 can be formed.

By the above-mentioned direct drawing type exposure method in which a laser beam oscillator is used, when a laser beam of a certain size is directly irradiated on photo resist provided on the substrate and the thus irradiated laser beam is subjected to scanning, it is possible to draw a predetermined pattern. In the case of the aforementioned method, as the size of a pattern has been reduced, it is necessary to also reduce the beam size and the scanning pitch. Necessarily, a quantity of drawing data to be processed are increased, and it becomes difficult or impossible to quickly process such a large quantity of drawing data by the system of the direct beam exposure device. As a result, throughput is lowered. The reason why throughput is lowered is that not only a fine pattern but also the other patterns, such as an electric power source pattern, a ground pattern and other plating patterns, which are "solid" patterns having large areas, must be uniformly exposed to a laser beam with a fine beam size and pitch.

An improved exposure method and apparatus according to the present invention will now be described.

The present invention can be mainly performed by using an exposure device manufactured by Ball Semiconductor Co. An optical source, i.e., an optical source used for DMD (Digital Micro-mirror Device) which is an exposure device manufactured by Ball Semiconductor Co., is a laser or mercury lamp. In the following embodiment of the present invention, a laser is used for the optical source.

However, it is possible to apply the present invention to an exposure device, other than the exposure device manufactured by Ball Semiconductor Co., in which an electron beam is used.

In this connection, the exposure device manufactured by Ball Semiconductor Co. is referred to as DMD or DLP (Digital Light Processor), which is a device to conduct exposure by using image display parts manufactured by Texas Instruments Co.

Figure 3:
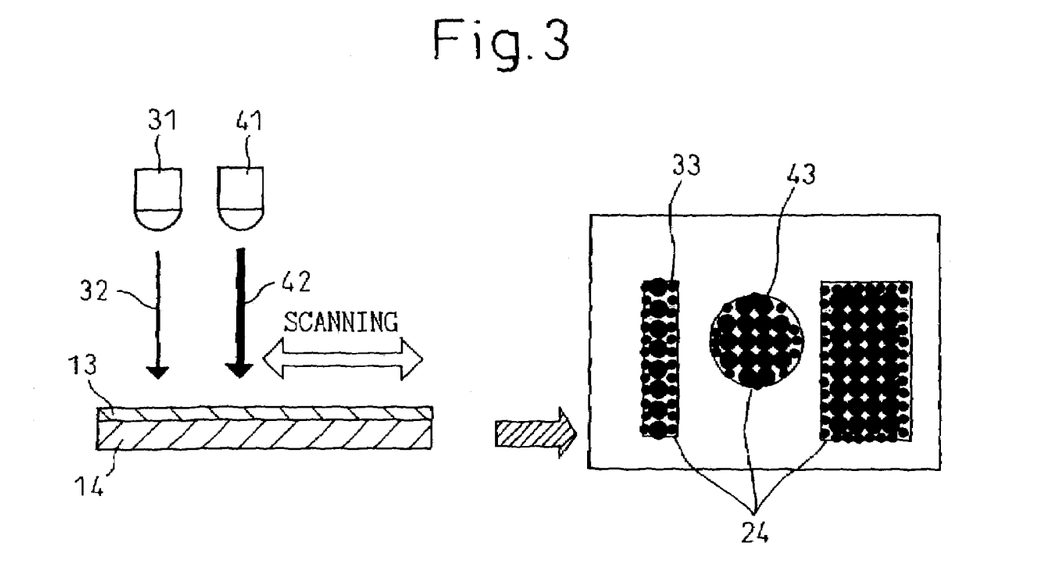
FIG. 3 is a view showing an improved maskless exposure method conducted by a laser beam.
Figure 5:
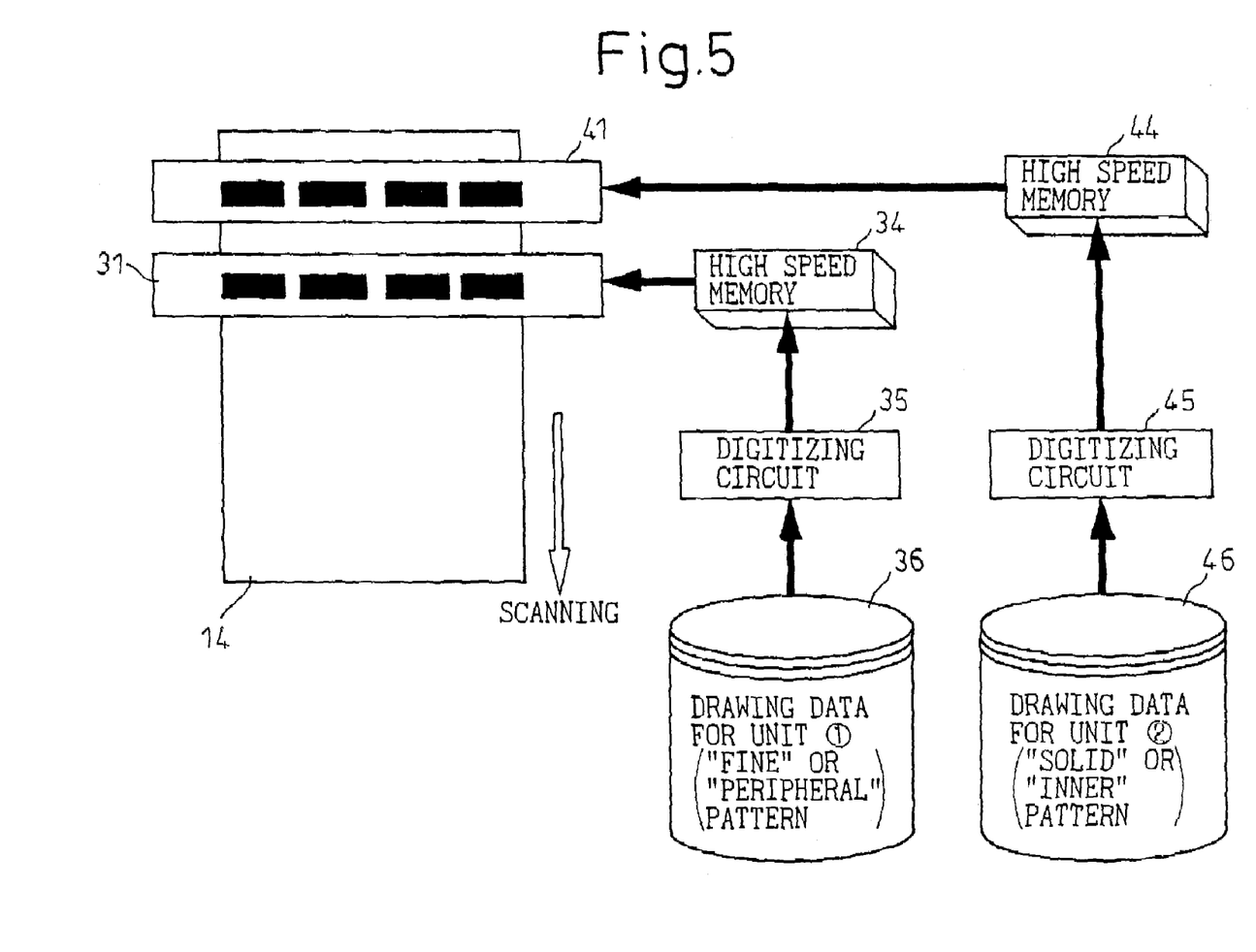
FIG. 5 is a view schematically showing an improved maskless exposure device conducted by a laser beam.

FIG. 3 is a view schematically showing the improved maskless exposure device of the present invention in which a maskless exposure, not using a photo mask, is conducted and drawing exposure is directly conducted by a laser beam. FIG. 5 is a view showing the principle of an exposure device in which the maskless exposure method of the present invention is conducted.

Referring to FIG. 3, the exposure device of the present invention is provided with a plurality of optical sources 31, 41, the sizes of which are different from each other. That is, the exposure device of the present invention includes: a first laser beam source 31 for irradiating a laser beam of a small irradiating area, for example, a laser beam of a small size; and a second laser beam source 41 for irradiating a laser beam of a large irradiating area, for example, a laser beam of a large size. While scanning is being independently and relatively conducted between the first laser beam source and the wiring board and also between the second laser beam source and the wiring board, drawing exposure is directly conducted by the first and the second laser beam source onto the face to be exposed on the substrate on which photo resist is coated.

Referring to FIG. 5, drawing data to be exposed by the first laser beam source (DMD optical source unit) 31 and drawing data to be exposed by the second laser beam source (DMD optical source unit) 41 are respectively and previously stored in the data bases 36, 46. These laser beam sources 31, 41 are respectively controlled by the high speed memories 34, 44 via the digitizing circuits 35, 45. Due to the foregoing, the laser beams 32, 42 are directly irradiated on the substrate 14, on the surface of which resist 13 is coated, by the first and the second laser beam source units 31, 41.

Due to the foregoing, as shown on the right of FIG. 3, the peripheral region 33 of the exposure region 24 is finely exposed by the first laser beam source, and the inner region 43 of the exposure region 24 is "solidly" exposed by the second laser beam source.

Next, referring to FIGS. 6 to 10, explanations will be made into a drawing data processing procedure in the case of using two types of laser beam source units shown in FIGS. 3 and 5. In this connection, in the case where not less than three types of laser beam sources are used, the same principle can be applied.

Figure 6:
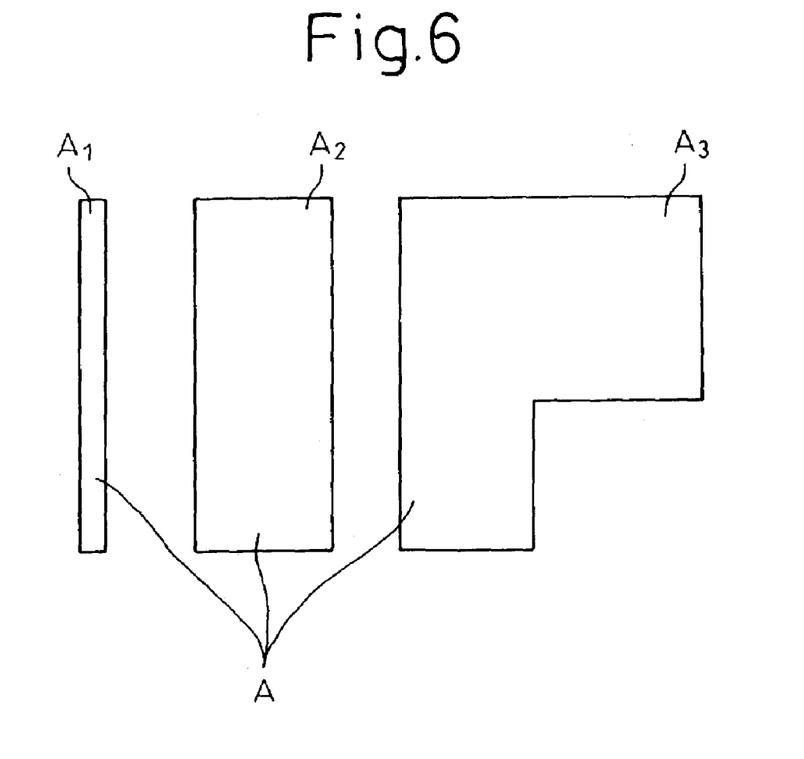
FIG. 6 is a view showing a definition of an original figure which is an object of drawing.

(1) First, referring to FIG. 6, a definition is given to a figure which becomes an object of drawing. Concerning the figure which becomes the object of drawing, for example, as shown in this drawing, it is assumed that the figure is composed of three figure patterns including a fine straight (A1) pattern, wide pattern (A2) and "solid" pattern (A3). These figures altogether constitute an original figure represented by character "A". Of course, the same procedure as that described as follows can be applied to other figure patterns.

Figure 7:
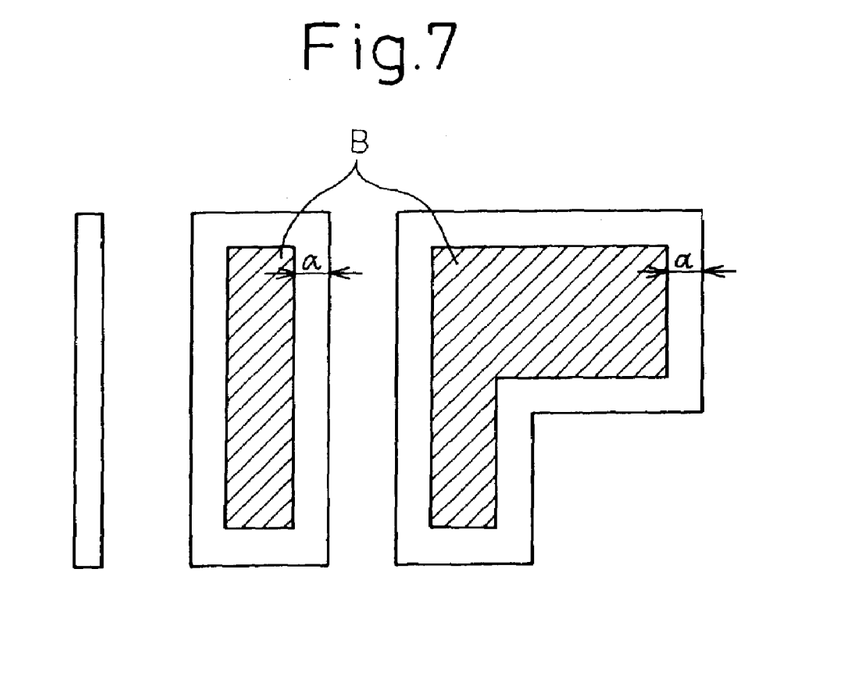
FIG. 7 is a view showing a thinning processing by which an original figure is thinned.

(2) Next, in FIG. 7, "the fine figure" and "the peripheral portion" are extracted. So-called "thinning processing" is conducted on figure A shown in FIG. 6. In this case, "thinning processing" is a graphic processing by which a predetermined quantity (α) is scraped off from a profile of a figure, that is, "thinning processing" is a graphic processing by which a figure is reduced by a quantity (α). For example, the width of a fine pattern shown on the left of figure A (A straight fine pattern is shown as an example.) is reduced by "thinning processing", that is, the area is reduced. Therefore, the width of the fine pattern shown on the left of figure A is eliminated. Figure B (Area B) is a figure generated by "thinning processing".

Figure 8:
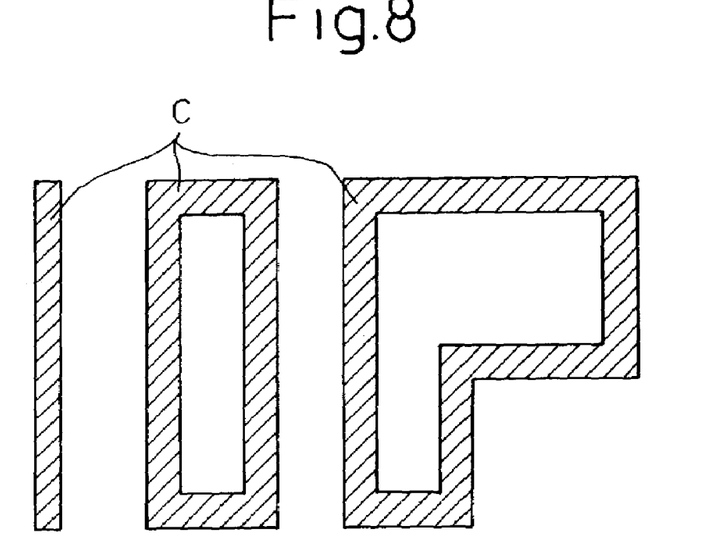
FIG. 8 is a view showing an extraction processing by which "a fine figure" and "a peripheral portion" are extracted.

(3) Next, in FIG. 8, "the fine figure" and "the peripheral portion" are extracted. A graphic calculation (A−B) is conducted between figure A shown in FIG. 6 and figure B shown in FIG. 7. Figure C is the result obtained by this graphic calculation (A−B).

Figure 9:
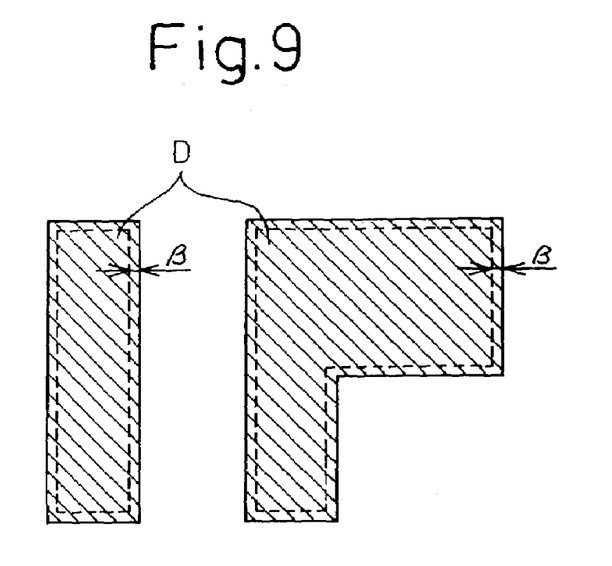
FIG. 9 is a view showing an extraction processing by which "an inner or solid pattern" is extracted.

(4) Next, in FIG. 9, "the inner pattern" or "the solid pattern" is extracted. "Thickening processing" is somewhat conducted on result B obtained as a result of "thinning processing" shown in FIG. 7. In this case, "thickening processing" is a graphic processing by which a profile of a figure is increased by a predetermined quantity (β), that is, "thickening processing" is a processing by which a figure is enlarged. In this case, the predetermined quantity (β) by which the profile of the figure is enlarged by "thickening processing" is smaller than the predetermined quantity (α) which is scraped off from the profile of the figure, by "thinning processing". Figure D is a figure generated by "thickening processing".

Figure 10:
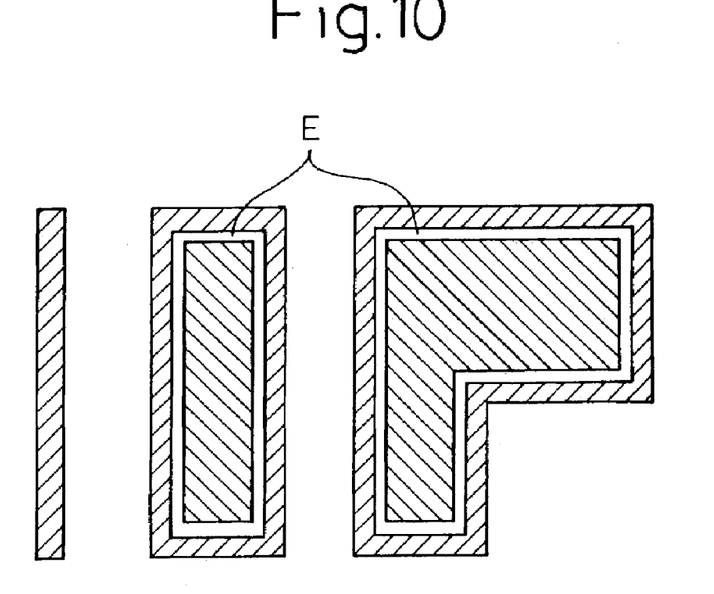
FIG. 10 is a view showing an overlapping state in which "a peripheral portion" and "inner or solid portion" are overlapping.

Between figures D and C, a small overlapping portion (figure E) exists as shown in FIG. 10. By this small overlapping portion, it is possible to prevent the generation of a "gap" in the case where exposure is conducted by two different optical sources. If an inside profile of the doughnut-shaped pattern of figure C was a little displaced to the inside, the same effect could be provided.

Figure 11:
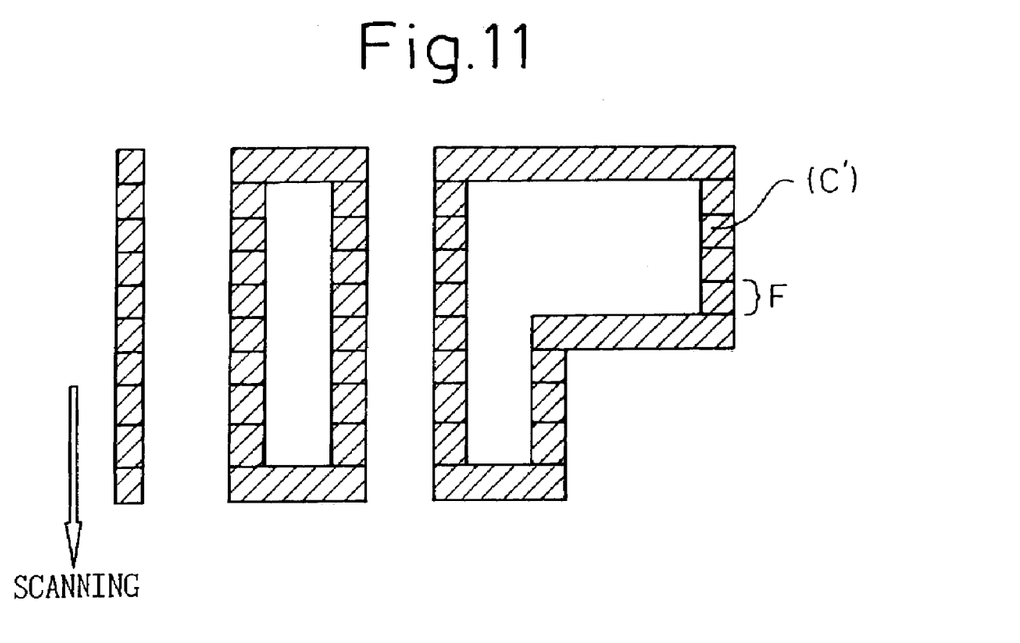
FIG. 11 is a view showing a splitting processing by which a figure is split.

(5) Next, in FIG. 11, the figure is split. When exposure is conducted, the substrate and the optical source are subjected to scanning in a constant direction relatively to each other. Since a spatial region, in which the optical source can conduct exposure at the same time, is physically limited, the figures shown in FIGS. 8 and 9 are split as shown in FIG. 11. FIG. 11 is a view showing a case in which the figures shown in FIG. 8 are split. Although the split figure itself is not shown, in the same manner as that described above, the figure shown in FIG. 9 is split by a unit of a spatial region in which the optical source can conduct exposure at the same time.

For example, when the region shown in FIG. 8 is exposed to light by the first optical source 31 from which a beam of light of a small size is irradiated and when the substrate and the optical source are subjected to scanning relatively in the direction of an arrow, figure pattern C' can be obtained, by which the figure is split into regions in which the first optical source 31 can conduct exposure at the same time. One section of this figure pattern C' is a region in which the first optical source 31 can conduct exposure at the same time. The thus split figures are stored in the data base shown in FIG. 5 in the order of appearance in the scanning process.

(6) Next, figure data are digitized. "The digitizing circuit" controls the optical source via the built-in optical source drive unit as follows. (a) The digitizing circuit is synchronized with the substrate scanning. (b) Figure data belonging to a specific region to be drawn are retrieved from the data base. (c) Digitizing is conducted. (d) Digitized data are temporarily read out from "the high speed memory", so that the optical source can be controlled via the built-in optical source drive unit. It is possible to consider the following procedure, as long as the capacity of the data base is sufficiently large. That is to say, digitized data are made before starting exposure, and the thus made data are accumulated on the data base. In this case, "the digitizing circuit" performs functions of the above items (a), (b) and (c).

In the present invention, "digitizing" is defined as processing (binarizing) in which graphic data belonging to a specific region to be drawn are divided into an exposure portion and a non-exposure portion, and "digitizing circuit" is defined as a circuit in which the above processing is conducted. In general, "digitization" is a terminology used in the case where a physical quantity is replaced with a quantity defined by the quantum theory. However, it should be noted that the terminology of digitization in the present invention is used in the meaning different from that generally used.

The procedure of graphic data processing of the present invention will be explained with reference to the flow charts shown in FIGS. 12, 13(*a*) and 13(*b*).

Figure 12:
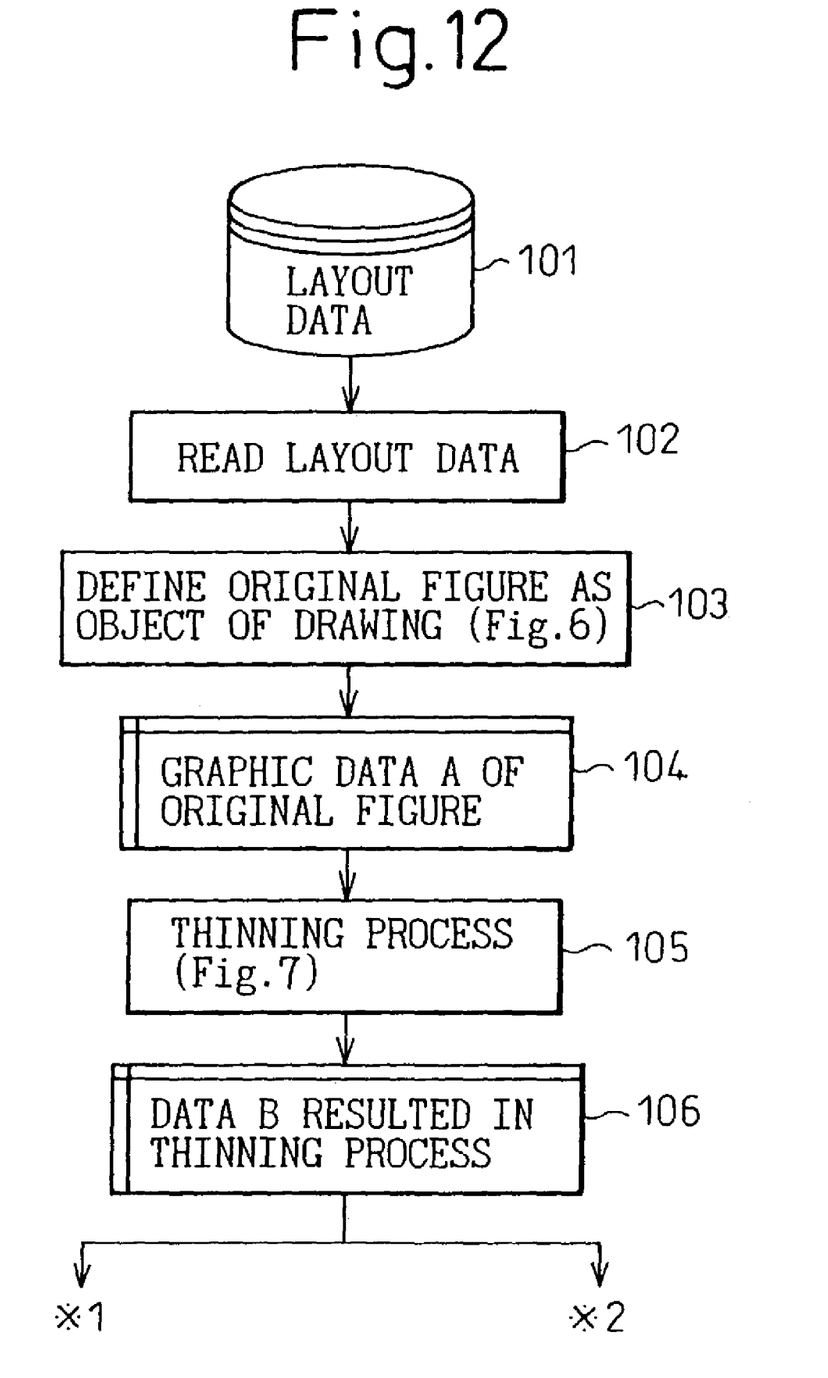
FIGS. 12, 13(a) and 13(b) are flow charts showing a figure processing.

In step 102 shown in FIG. 12, data for designing the layout of a figure are read in from the data base (101). Next, in step 103, original figure A, which is an object of drawing explained in FIG. 6, is defined, and graphic data of the original figure are obtained in step 104. Next, in step 105, thinning processing is conducted in such a manner that the peripheral profile of figure A is thinned inward by a predetermined quantity (a). When this thinning processing (resizing) is conducted, for example, graphic processing described in Japanese Unexamined Patent Publication No. 2000-222449 may be performed. As a result of this thinning processing, figure B can be obtained in step 106.

Figure 13A:
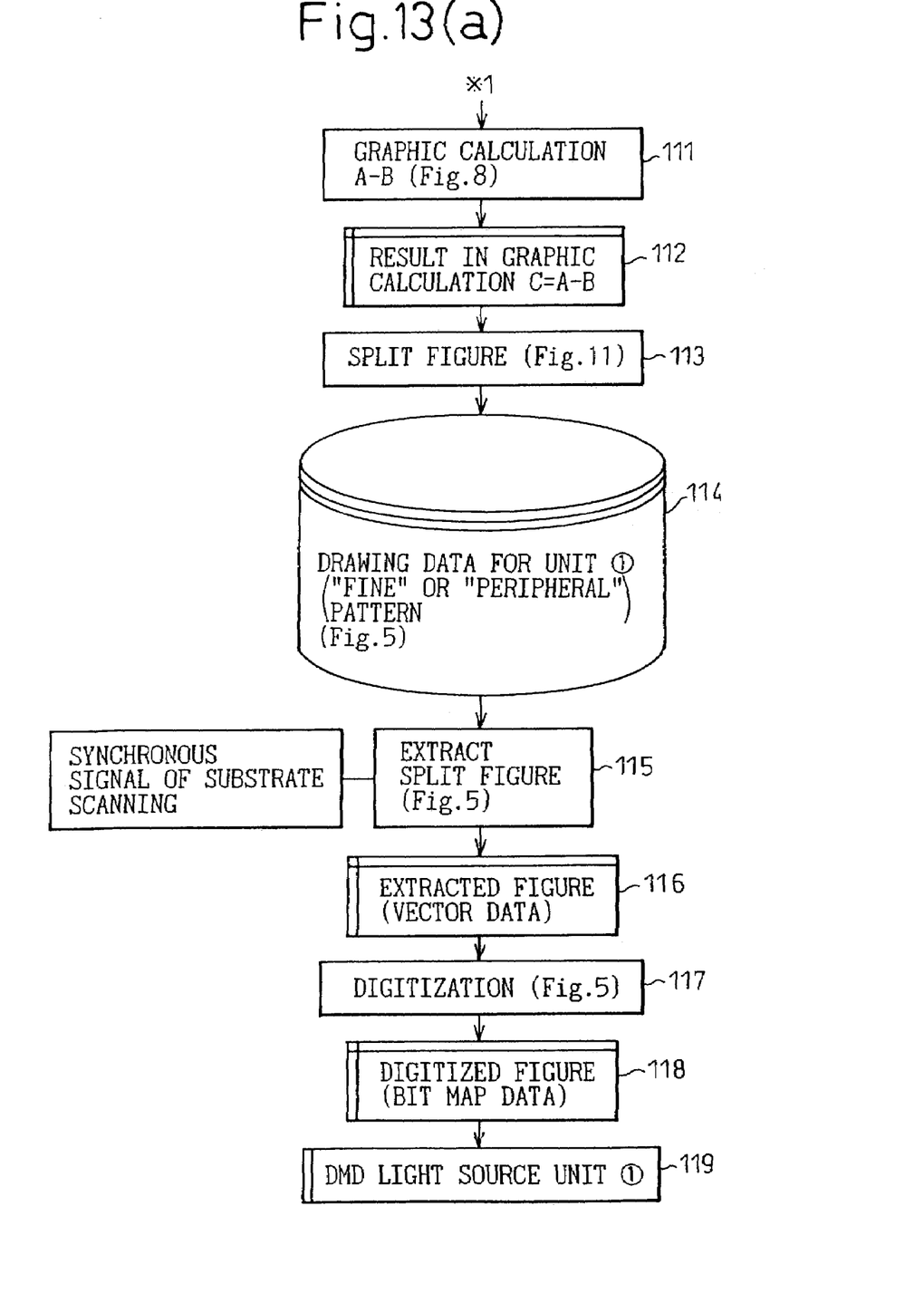

The flow chart in FIG. 13(*a*) shows a procedure for exposing the peripheral portion of a figure to light, and the flow chart on the right shows a procedure for exposing the inner portion (solid pattern) of the figure to light.

In step 111, the graphic calculation (A−B) explained in FIG. 8 is conducted. This graphic calculation (1) can be performed by the well-known bit map method or the vector method. Concerning the subtraction processing of a figure performed by the bit map method or vector method, the detail are explained, for example, in "VLSI Design Series Volume 1: Circuit and Layout" by Watanabe, Asada, Kani and Otsuki in Iwanami Course Micro Electronics Published by Iwanami Shoten in 1985, which is referred to as Document (1) in this specification. Due to the foregoing, the result of the graphic calculation (A−B)=C is obtained in step 112.

Next, in step 113, the figure is split as explained in FIG. 11. In the case of splitting a polygon, for example, the algorithm explained in the following document is applied.

"Partitioning a Polygonal Region into Trapezoids" by Taro Asano, Tetsuo Asano, Hiroshi Imai; Journal of ACM, Vol. 33, No. 2, April 1986; pp. 290–312, which is referred to as Document (2) in this specification.

If necessary, the figure is further split so that the split figure (rectangle, trapezoid and triangle) can be accommodated in a space in which it can be exposed to light at the same time. When the figure is split as described above, drawing data "Fine" or "Periphery" for the optical source unit 31 shown in FIG. 5 can be obtained in step 114.

Next, in step 115, the split figure is extracted according to the synchronous signal of substrate scanning as shown in FIG. 5. Due to the foregoing, vector data, which represents an extracted figure, can be obtained in step 116.

Next, in step 117, digitization is performed by the digitizing circuit as shown in FIG. 5. Due to the foregoing, the digitized figure (bit map data) can be obtained in step 118. According to the digitized figure (bit map data), a DMD optical source unit 31 is driven in step 119.

Figure 13B:
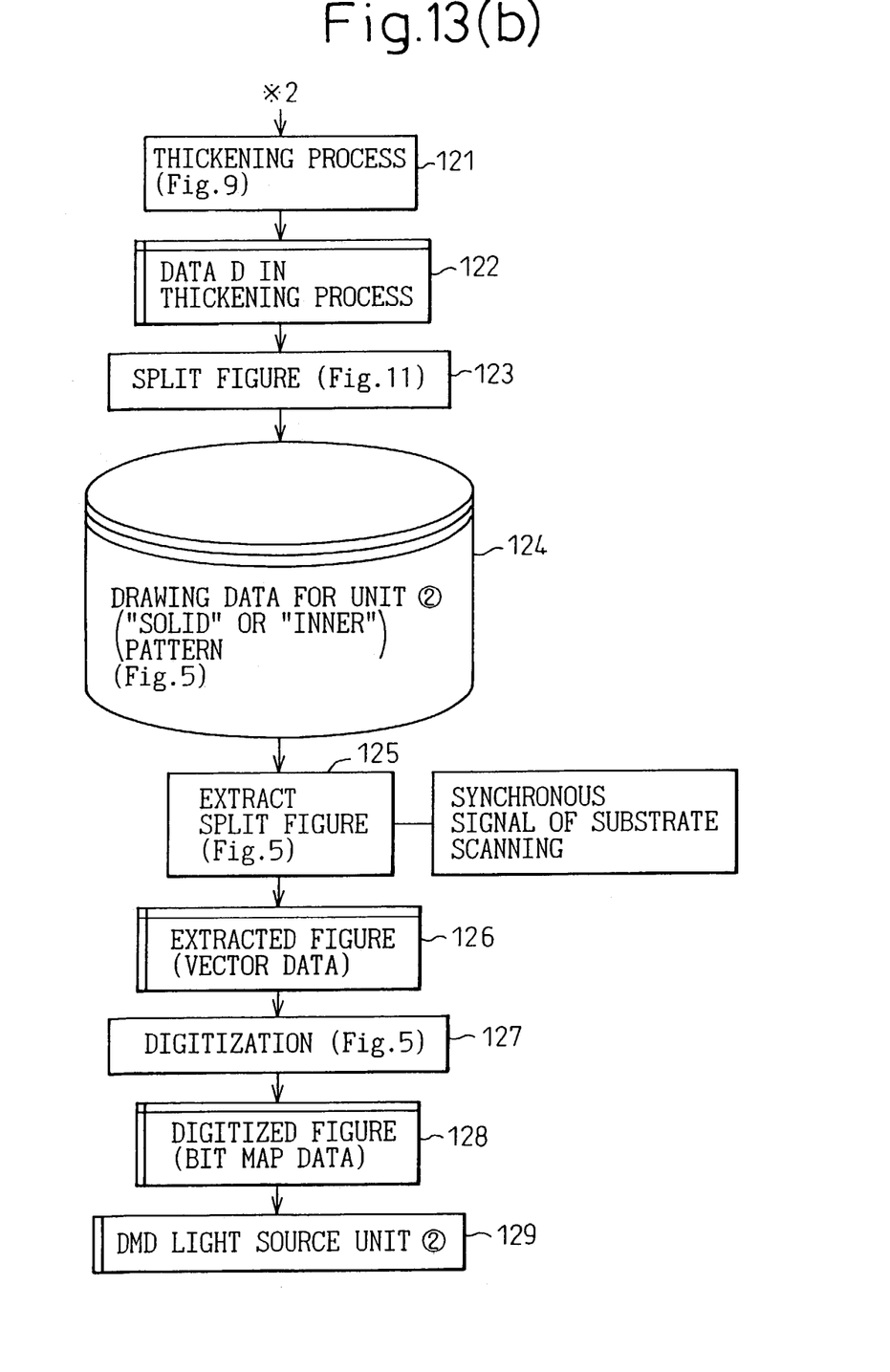

The flow chart in FIG. 13(*b*) shows a procedure of exposing the inner portion of the figure. The steps 121 to 129 respectively correspond to the steps 111 to 119 of the flow chart shown in FIG. 13(*a*).

In step 121, thickening processing is performed as explained in FIG. 9. In the same manner as the thinning processing explained in step 105, the graphic calculation of this thickening processing can be performed, for example, as described in Japanese Unexamined Patent Publication No. 2000-222449. As a result of this thickening process, figure D can be obtained in step 122.

Next, in step 123, the figure is split as explained in FIG. 11. In this case of splitting the figure, it is possible to apply the algorithm explained in Document (2) in the same manner as the splitting of a polygon explained in step 113. In the same manner as that described before, if necessary, the figure is further split so that the split figure (rectangle, trapezoid and triangle) can be accommodated in a space in which it can be exposed to light at the same time. When the figure is split as described above, drawing data "Solid" or "Inner" portion for the optical source unit (2) shown in FIG. 5 can be obtained in step 124.

Next, in step 125, the split figure is extracted according to the synchronous signal of substrate scanning as shown in FIG. 5. Due to the foregoing, vector data, which represent an extracted figure, can be obtained in step 126.

Next, in step 127, digitization is performed by the digitizing circuit as shown in FIG. 5. Due to the foregoing, the digitized figure (bit map data) can be obtained in step 128. According to the digitized figure (bit map data), a DMD optical source unit 41 is driven in step 129.

Referring to the accompanying drawings, the embodiment of the present invention has been explained above. However, it should be noted that the present invention is not limited to the above specific embodiment but variations may be made by one skilled in the art without departing from the spirit and scope of the present invention.

In the above embodiment, concerning the optical source units, there are provided two types of optical source units, one is DMD optical source unit 31, the laser beam size of which is small, and the other is DMD optical source unit 41, the laser beam size of which is large. However, for example, of course, it is possible to use not less than three types of optical source units, the laser beam sizes of which are different from each other. In this case, the figure pattern is not split into two types of "Fine" or "Periphery" and "Solid" or "Inner" portion, but split into three types in which these region, i.e., "Fine" or "Periphery" region, "Intermediate", region, and "Solid" or "Inner" region, are provided. Alternatively, it is possible to split the figure into not less than four types.

As described above, there are provided a plurality of optical sources for realizing laser beam irradiating areas which are different from each other. Therefore, in the region to be exposed to light, the fine exposure pattern portion and the coarse exposure pattern portion can be exposed to light by different optical sources.

When the peripheral region of the exposure region is exposed to light by the first optical source suitable for drawing a fine pattern and when the inner region of the exposure region is exposed to light by the second optical source suitable for drawing a solid pattern, the throughput in the case of exposing one exposure region can be greatly enhanced. When the peripheral portion of the exposure region is finely scanned by the first optical source and when the inner region of the exposure region is roughly scanned by the second optical source, the throughput in the case of exposing one exposure region can be further enhanced.

Due to the foregoing, it becomes possible to prevent the drawing data from increasing unnecessarily, and further it becomes possible to prevent the data processing speed in the device from lowering. Therefore, exposure processing can be performed at high speed.

The invention claimed is:

1. An optical exposure method for forming exposure patterns on a surface of a work, said method comprising the following steps of:
   providing to a work, an exposure-susceptible surface to be exposed; and
   irradiating a single exposing region of the surface to be exposed with a plurality of optical beams having different irradiating areas and having different scanning pitches, respectively, wherein said single exposing region on the surface to be exposed comprises a peripheral area and an inner area, and wherein said irradiating step comprises:
   irradiating said peripheral area with an optical beam having a smaller irradiating area and irradiating said inner area with an optical beam having a larger irradiating area.

2. An optical exposure method as set forth in claim 1 further comprising the following steps of:
   extracting said inner area from said exposing region, said extracting step comprising a step of thinning by a predetermined amount ($\alpha$) inward from a peripheral outline of a figure (A) of said exposing region so that a figure (B) is obtained by said thinning step.

3. An optical exposure method as set forth in claim 2 further comprising the following steps of graphic processing:
   subtracting said figure (B) obtained by the preceding thinning step from said figure (A) of said exposing region to obtain a figure (C);
   splitting said figure (C) thus obtained into a plurality of areas, each of which area being a single unit of space which can be exposed by a single beam having said smaller irradiating area;
   thickening said figure (B) obtained by said thinning step by a predetermined amount ($\beta$), which is smaller than said predetermined amount ($\alpha$) at said thinning step, outward so that a figure (D) is obtained by said thickening step; and
   splitting said figure (D) thus obtained by said thickening step into a plurality of areas, each of which is a single unit of space which can be exposed by a single beam having said larger irradiating area.

4. An optical exposure method as set forth in claim 3, wherein said surface to be exposed comprises a surface of wiring board or semiconductor board and wherein said method further comprising the following step of:
   independently scanning a first optical source of the single beam having the smaller irradiating area and a second optical source of the single beam having the larger irradiating area with respect to said wiring or semiconductor board.

5. An optical exposure method as set forth in claim 4 further comprising the following steps of:
   inputting the figure data (C,D) into a data base;
   conducting a retrieval of said figure data (C,D), which belongs to the region to be graphically processed, synchronously with said scanning step from said data base;
   digitizing said retrieved figure data; and
   accumulating said digitized figure data in a memory.

6. An optical exposure method as set forth in claim 5 further comprising the following steps:
   reading out the digitized data from said memory by an optical source unit for controlling said first and second optical sources; and
   driving said first and second optical sources on the basis of the digitized data.

7. An optical exposure method as set forth in claim 6, wherein said optical beams are laser beams having different irradiating areas.

8. An optical exposure method as set forth in claim 1, wherein the work is a wiring board.

9. An optical exposure method as set forth in claim 1, wherein the work is a semiconductor board.

* * * * *